United States Patent
Lv

(10) Patent No.: US 9,525,070 B1
(45) Date of Patent: Dec. 20, 2016

(54) TFT SUBSTRATE STRUCTURE AND MANUFACTURING METHOD THEREOF

(71) Applicant: Shenzhen China Star Optoelectronics Technology Co., Ltd., Shenzhen (CN)

(72) Inventor: Xiaowen Lv, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/778,079

(22) PCT Filed: Jul. 27, 2015

(86) PCT No.: PCT/CN2015/085164
§ 371 (c)(1),
(2) Date: Sep. 17, 2015

(51) Int. Cl.
*H01L 29/786* (2006.01)
*H01L 29/267* (2006.01)
(Continued)

(52) U.S. Cl.
CPC ..... *H01L 29/78618* (2013.01); *H01L 29/1604* (2013.01); *H01L 29/24* (2013.01); *H01L 29/267* (2013.01); *H01L 29/4908* (2013.01); *H01L 29/66765* (2013.01); *H01L 29/7869* (2013.01); *H01L 29/78669* (2013.01); *H01L 29/78696* (2013.01)

(58) Field of Classification Search
CPC .............. H01L 29/78618; H01L 29/24; H01L 29/7869; H01L 29/4908; H01L 29/1604; H01L 29/78696; H01L 29/267; H01L 29/66765; H01L 29/78669
See application file for complete search history.

(56) References Cited

U.S. PATENT DOCUMENTS

2009/0045404 A1\* 2/2009 Sakai ............... H01L 29/41733 257/59
2013/0087781 A1\* 4/2013 Yeh .................. H01L 29/41733 257/43
(Continued)

FOREIGN PATENT DOCUMENTS

CN 101814455 A 8/2010

*Primary Examiner* — Mamadou Diallo
(74) *Attorney, Agent, or Firm* — Leong C. Lei

(57) ABSTRACT

The present invention provides a TFT substrate structure and a manufacturing method thereof. A metal oxide semiconductor layer is formed on an amorphous silicon layer to replace an N-type heavily-doped layer. The potential barrier between the amorphous silicon layer and metal layer is relatively low, making it possible to form an ohmic contact and thus increasing current efficiency, without the need of doping other ions to form the N-type heavily-doped layer. Further, the metal oxide semiconductor layer comprises numerous defects that trap holes so that during the operation of the TFT, even a great negative voltage is applied to the gate terminal to thus form a hole conducting channel, the holes may hardly move from the source/drain terminals through the metal oxide semiconductor layer and the semiconductor layer to reach the conducting channel and consequently, the current leakage issue occurring in a hole conducting zone of a conventional TFT substrate structure can be improved and severe bending of the hole current curve and poor reliability are also improved.

14 Claims, 5 Drawing Sheets

(51) Int. Cl.
*H01L 29/16* (2006.01)
*H01L 29/24* (2006.01)
*H01L 29/49* (2006.01)
*H01L 29/66* (2006.01)

(56) References Cited

U.S. PATENT DOCUMENTS

2015/0303222 A1* 10/2015 Ning .................... G02F 1/1368
257/43
2016/0225912 A1* 8/2016 Cao ....................... H01L 29/786

* cited by examiner

US 9,525,070 B1

TFT SUBSTRATE STRUCTURE AND MANUFACTURING METHOD THEREOF

BACKGROUND OF THE INVENTION

1. Field of the Invention

The present invention relates to the field of display technology, and in particular to a thin-film-transistor (TFT) substrate structure and a manufacturing method thereof.

2. The Related Arts

Amorphous silicon (a-Si) is the most widely used semiconductor material in the semiconductor industry. The a-Si material shows a great potential difference when put in contact with metals, making it hard to form an ohmic contact. In practical applications, in order to make an ohmic contact between a metal and a semiconductor, it is commonplace to heavily dope element P in a surface of the semiconductor for lowering the contact resistance between the metal and the semiconductor and increasing current efficiency.

FIG. 1 is a schematic view, in a sectioned form, showing a conventional thin-film transistor (TFT) substrate structure. The TFT substrate structure comprises a base plate 100, a gate terminal 200 formed on the base plate 100, a gate insulation layer 300 formed on the base plate 100 and covering the gate terminal 200, an amorphous silicon layer 400 formed on the gate insulation layer 300 to correspond to the gate terminal 200, and a source terminal 500 and a drain terminal 600 formed on amorphous silicon layer 400 and the gate insulation layer 300. The amorphous silicon layer 400 has a middle portion that is downward recessed so as to define a channel zone 450 located above and corresponding to the gate terminal 200. The amorphous silicon layer 400 has a surface that is doped with ions at portions thereof respectively corresponding to two sides of the channel zone 450 so as to form first and second N-type heavily-doped zones 410, 420. The source terminal 500 and the drain terminal 600 are respectively set in contact with the surfaces of the first and second N-type heavily-doped zones 410, 420.

FIG. 2 shows a curve of a leakage current of an a-Si device involving the TFT substrate structure of FIG. 1. It is known from FIG. 2 that certain problems exist when an operation current (Ion) of the TFT substrate structure is increased. When the loading voltage reaches a predetermined level, positive charges are induced so as to generate a hole-conducting channel. The leakage current (Ioff) is thus increased, making the curve severely bent and leading to a reliability issue.

Thus, it is desired to provide a TFT substrate structure and a manufacturing method thereof that overcome the above problems.

SUMMARY OF THE INVENTION

An object of the present invention is to provide a thin-film transistor (TFT) substrate structure, which uses a metal oxide semiconductor layer to replace an N-type heavily-doped layer, wherein the metal oxide semiconductor has a relatively low potential barrier with respect to a metal layer so as to make it possible to form an ohmic contact thereby increasing current efficiency and lowering a leakage current.

Another object of the present invention is to provide a manufacturing method of a TFT substrate structure, in which a metal oxide semiconductor layer is formed on an amorphous silicon layer to replace an N-type heavily-doped layer, wherein the metal oxide semiconductor has a relatively low potential barrier with respect to a metal layer so as to make it possible to form an ohmic contact without involving an N-type heavily-doped layer by doping other ions and also help reduce a leakage current of a hole conducting zone, reducing bending of the curve and improving reliability of the TFT substrate structure.

To achieve the above objects, the present invention provides a TFT substrate structure, which comprises a base plate, a gate terminal formed on the base plate, a gate insulation layer formed on the base plate and covering the gate terminal, an active layer formed on the gate insulation layer, and a second metal layer formed on the active layer, wherein the second metal layer comprises a first strip-like passage that is located above and corresponds to the gate terminal and a source terminal and a drain terminal respectively formed on two opposite sides of the first strip-like passage;

the active layer comprises an amorphous silicon layer and a metal oxide semiconductor layer formed on the amorphous silicon layer, the metal oxide semiconductor layer comprising a second strip-like passage that corresponds to the first strip-like passage and first and second metal oxide semiconductor segments respectively formed on two opposite sides of the second strip-like passage and respectively corresponding to the source and drain terminals, the amorphous silicon layer comprising a channel zone located under and corresponding to the second strip-like passage, a portion of the amorphous silicon layer that is located in the channel zone having a thickness that is less than or equal to a thickness of a remaining portion thereof; and the source terminal and the drain terminal are respectively in contact engagement with surfaces of the first metal oxide semiconductor segment and the second metal oxide semiconductor segment and the source terminal and the first metal oxide semiconductor segment occupy a surface area of the base plate that is identical to a surface area of the base plate that is occupied by the drain terminal and the second metal oxide semiconductor segment.

The metal oxide semiconductor layer comprises a material of IGZO.

The present invention also provides a manufacturing method of a TFT substrate structure, which comprises the following steps:

(1) providing a base plate, depositing a first metal layer on the base plate, and subjecting the first metal layer to patterning to form a gate terminal;

(2) sequentially depositing a gate insulation layer, an amorphous silicon layer, a metal oxide semiconductor layer, and a second metal layer on the base plate and the gate terminal, wherein the amorphous silicon layer and the metal oxide semiconductor layer collectively constitute an active layer; and (3) applying a photolithographic process to subject the second metal layer and the metal oxide semiconductor layer to patterning so as to form, in the second metal layer, a first strip-like passage that is located above and corresponds to the gate terminal and a source terminal and a drain terminal respectively located on two opposite sides of the first strip-like passage and to form, in the metal oxide semiconductor layer, a second strip-like passage corresponding to the first strip-like passage and a first metal oxide semiconductor segment and a second metal oxide semiconductor segment respectively located on opposite two sides of the second strip-like passage and also to form, in the amorphous silicon layer, a channel zone located under and corresponding to the second strip-like passage in such a way that a portion of the amorphous silicon layer within the channel zone is equal to a thickness of a remaining portion thereof, wherein the source terminal and the drain terminal are respectively in contact engagement with surfaces of the first metal oxide semiconductor segment and the second metal oxide semiconductor segment and the source terminal and the first metal oxide semiconductor segment occupy a surface area of the base plate that is identical to a surface area of the base plate that is occupied by the drain terminal and the second metal oxide semiconductor segment.

The manufacturing method further comprises step (4), in which the portion of the amorphous silicon layer that is located in the channel zone is subjected to a surface treatment to remove residues of the metal oxide semiconductor layer left on the channel zone in such a way that after the treatment, the thickness of the portion of the amorphous silicon layer within the channel zone is substantially equal to the thickness of the remaining portion thereof.

The manufacturing method may alternatively further comprises step (4'), in which with the source and drain terminals and the first and second metal oxide semiconductor segments as an etch stop layer, the portion of the amorphous silicon layer that is located in the channel zone is subjected to partial etching so as to have a thickness of the portion of the amorphous silicon layer within the channel zone less than the thickness of a remaining portion thereof.

In step (2), chemical vapor deposition is adopted to deposit the gate insulation layer and the amorphous silicon layer and physical vapor deposition is adopted to deposit the metal oxide semiconductor layer.

In step (3), wet etching is applied to subject the second metal layer and the metal oxide semiconductor layer to patterning.

In step (4), dry etching is applied to subject the portion of the amorphous silicon layer within the channel zone to the etching.

In step (1), the base plate comprises a glass board and the gate terminal comprises a material of one of molybdenum, titanium, aluminum, and copper or a stacked combination of multiple ones thereof.

In step (2), the metal oxide semiconductor layer comprises a material of IGZO.

The present invention further provides a manufacturing method of a FT substrate structure, which comprises the following steps:

(1) providing a base plate, depositing a first metal layer on the base plate, and subjecting the first metal layer to patterning to form a gate terminal;

(2) sequentially depositing a gate insulation layer, an amorphous silicon layer, a metal oxide semiconductor layer, and a second metal layer on the base plate and the gate terminal, wherein the amorphous silicon layer and the metal oxide semiconductor layer collectively constitute an active layer; and (3) applying a photolithographic process to subject the second metal layer and the metal oxide semiconductor layer to patterning so as to form, in the second metal layer, a first strip-like passage that is located above and corresponds to the gate terminal and a source terminal and a drain terminal respectively located on two opposite sides of the first strip-like passage and to form, in the metal oxide semiconductor layer, a second strip-like passage corresponding to the first strip-like passage and a first metal oxide semiconductor segment and a second metal oxide semiconductor segment respectively located on opposite two sides of the second strip-like passage and also to form, in the amorphous silicon layer, a channel zone located under and corresponding to the second strip-like passage in such a way that a portion of the amorphous silicon layer within the channel zone is equal to a thickness of a remaining portion thereof, wherein the source terminal and the drain terminal are respectively in contact engagement with surfaces of the first metal oxide semiconductor segment and the second metal oxide semiconductor segment and the source terminal and the first metal oxide semiconductor segment occupy a surface area of the base plate that is identical to a surface area of the base plate that is occupied by the drain terminal and the second metal oxide semiconductor segment;

wherein in step (2), chemical vapor deposition is adopted to deposit the gate insulation layer and the amorphous silicon layer and physical vapor deposition is adopted to deposit the metal oxide semiconductor layer;

wherein in step (3), wet etching is applied to subject the second metal layer and the metal oxide semiconductor layer to patterning;

wherein in step (1), the base plate comprises a glass board and the gate terminal comprises a material of one of molybdenum, titanium, aluminum, and copper or a stacked combination of multiple ones thereof; and wherein in step (2), the metal oxide semiconductor layer comprises a material of indium gallium zinc oxide (IGZO).

The efficacy of the present invention is that the present invention provides a TFT substrate structure, which comprises a metal oxide semiconductor layer arranged on an amorphous silicon layer to replace an N-type heavily-doped layer. The amorphous silicon layer shows a lower potential barrier with respect to a metal layer, making it possible to form an ohmic contact and increase current efficiency. The present invention provides a manufacturing method of a TFT substrate structure, which comprises forming a metal oxide semiconductor layer on an amorphous silicon layer to replace an N-type heavily-doped layer. The amorphous silicon layer and the metal oxide semiconductor layer have a lower potential barrier therebetween, making it possible to form an ohmic contact, increasing current efficiency, without the need to dope other ions to make the N-type heavily-doped layer. Further, the metal oxide semiconductor layer comprises numerous defects that trap holes so that during the operation of the TFT, even a great negative voltage is applied to the gate terminal to thus form a hole conducting channel, the holes may hardly move from the source/drain terminals through the metal oxide semiconductor layer and the semiconductor layer to reach the conducting channel and consequently, the current leakage issue occurring in a hole conducting zone of a conventional TFT substrate structure can be improved and severe bending of the hole current curve and poor reliability are also improved.

BRIEF DESCRIPTION OF THE DRAWINGS

The features and technical contents of the present invention will be apparent from the following detailed description of the present invention and the attached drawing; however, these drawings are provided for reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
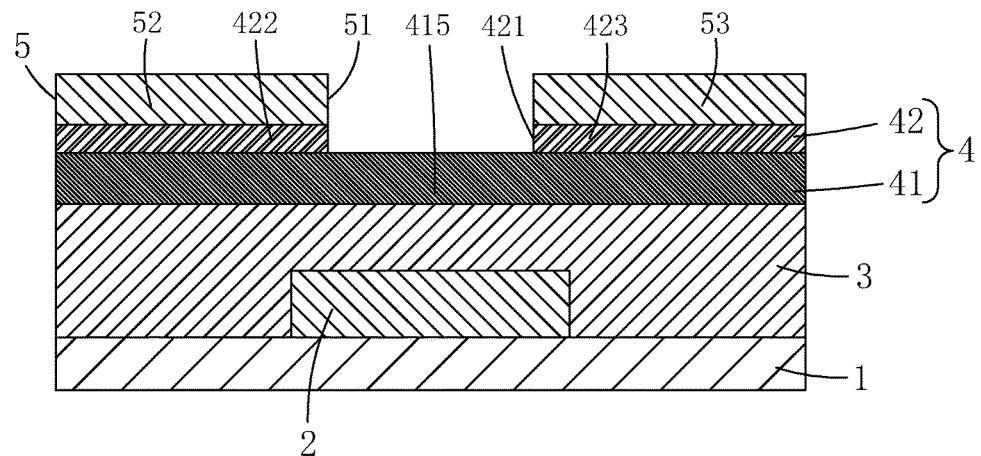
FIG. 3 is a schematic view, in a sectioned form, illustrating a first embodiment of a TFT substrate structure according to the present invention.
Figure 4:
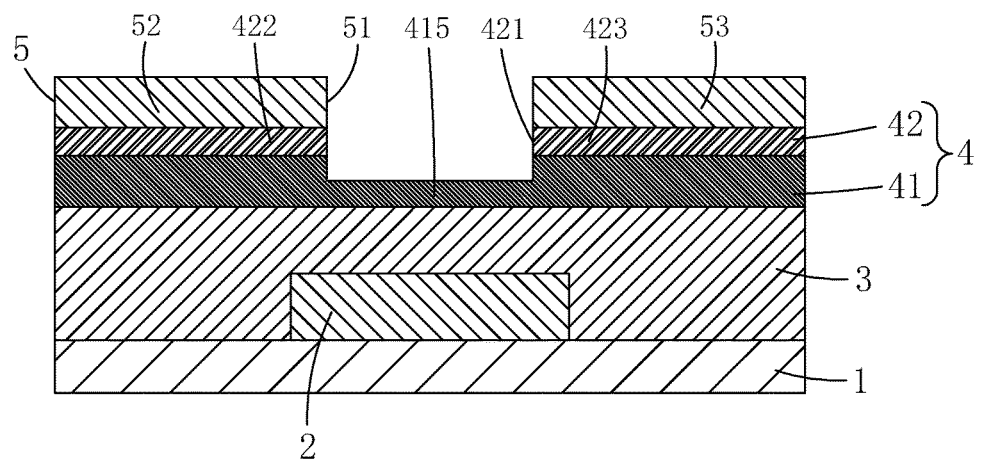
FIG. 4 is a schematic view, in a sectioned form, illustrating a second embodiment of the TFT substrate structure according to the present invention.

Referring to FIGS. 3-4, firstly, the present invention provides a thin-film transistor (TFT) substrate structure, which comprises a base plate 1, a gate terminal 2 formed on the base plate 1, a gate insulation layer 3 formed on the base plate 1 and covering the gate terminal 2, an active layer 4 formed on the gate insulation layer 3, and a second metal layer 5 formed on the active layer 4.

The second metal layer 5 comprises a first strip-like passage 51 that is located above and corresponds to the gate terminal 2 and a source terminal 52 and a drain terminal 53 respectively formed on two opposite sides of the first strip-like passage 51.

The active layer 4 comprises an amorphous silicon layer 41 and a metal oxide semiconductor layer 42 formed on the amorphous silicon layer 41. The metal oxide semiconductor layer 42 comprises a second strip-like passage 421 that corresponds to the first strip-like passage 51 and first and second metal oxide semiconductor segments 422, 423 respectively formed on two opposite sides of the second strip-like passage 421 and respectively corresponding to the source and drain terminals 52, 53. The amorphous silicon layer 41 comprises a channel zone 415 located under and corresponding to the second strip-like passage 421. A portion of the amorphous silicon layer 41 that is located in the channel zone 415 has a thickness that is less than or equal to a thickness of a remaining portion thereof.

The source terminal 52 and the drain terminal 52 are respectively in contact engagement with surfaces of the first metal oxide semiconductor segment 422 and the second metal oxide semiconductor segment 423 and the source terminal 52 and the first metal oxide semiconductor segment 422 occupy a surface area of the base plate 1 that is identical to a surface area of the base plate 1 that is occupied by the drain terminal 53 and the second metal oxide semiconductor segment 423.

Specifically, the first strip-like passage 51 and the second strip-like passage 421 are of the same width that is smaller than a width of the gate terminal 2.

As shown in FIG. 3, a schematic view, in a sectioned form, is provided to illustrate a first embodiment of the TFT substrate structure according to the present invention, in which the portion of the amorphous silicon layer 41 that is located in the channel zone 415 has a thickness that is equal to a thickness of a remaining portion thereof.

As shown in FIG. 4, a schematic view, in a sectioned form, is provided to illustrate a second embodiment of the TFT substrate structure according to the present invention, in which the portion of the amorphous silicon layer 41 that is located in the channel zone 415 has a thickness that is less than a thickness of a remaining portion thereof.

Specifically, the base plate 1 comprises a glass board.

The gate terminal 2, the source terminal 52, and the drain terminal 53 each comprise a material of one of molybdenum, titanium, aluminum, and copper or a stacked combination of multiple ones thereof.

The gate insulation layer 3 comprises a material of silicon oxide, silicon nitride, or a combination thereof.

Specifically, the metal oxide semiconductor layer 5 comprises a material of IGZO (Indium Gallium Zinc Oxide).

Figure 1:
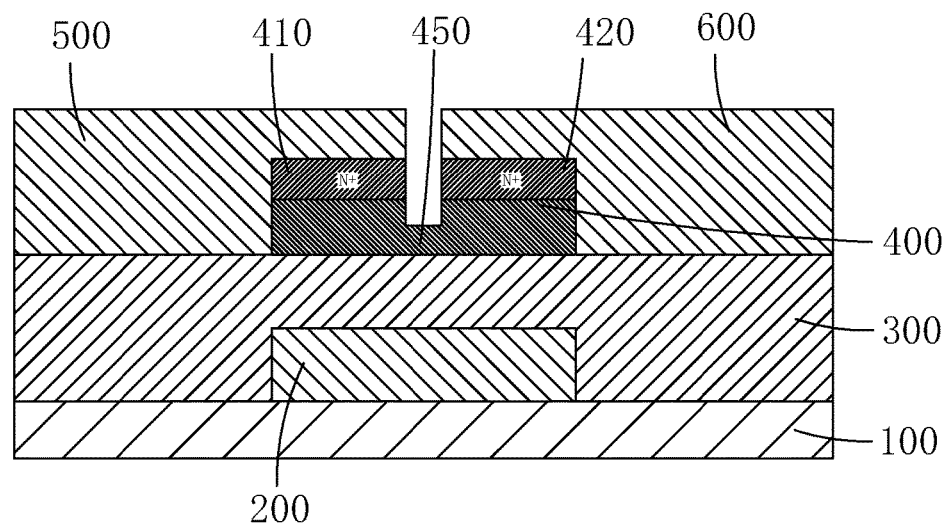
FIG. 1 is a schematic view, in a sectioned form, showing a conventional thin-film transistor (TFT) substrate structure.
Figure 2:
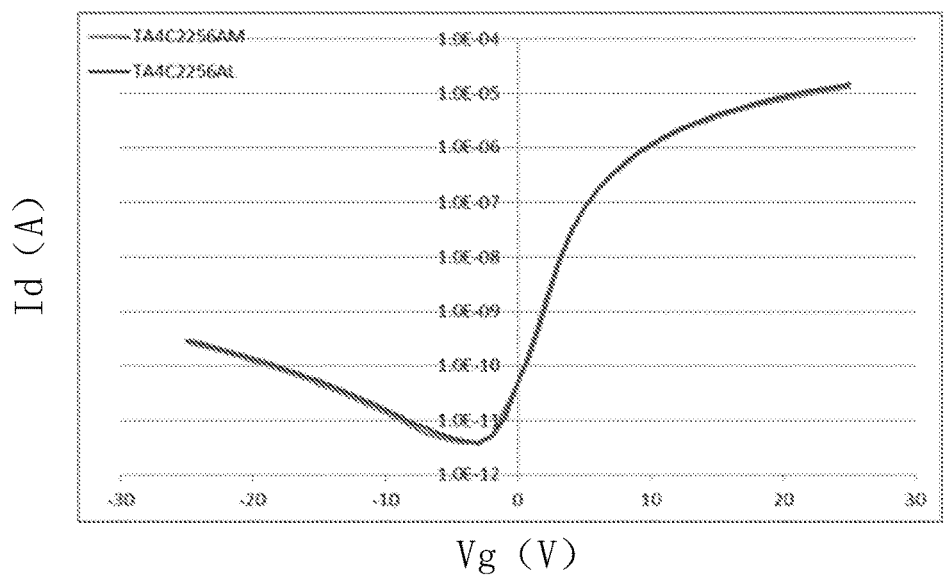
FIG. 2 shows a curve of a leakage current of an amorphous silicon (a-Si) device involving the TFT substrate structure of FIG. 1.
Figure 5:
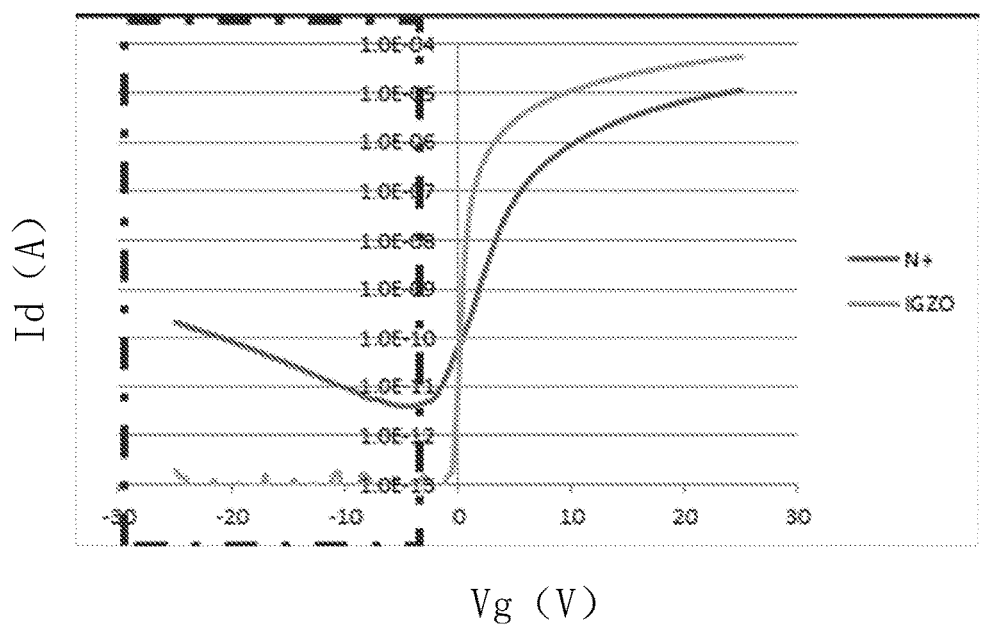
FIG. 5 shows a comparison between a curve of a leakage current of an amorphous silicon (a-Si) device involving the TFT substrate structure of FIG. 1 and a curve of a leakage current of an a-Si device involving the TFT substrate structure of FIG. 4.

FIG. 5 shows a comparison between a curve of a leakage current of an amorphous silicon (a-Si) device involving a TFT substrate structure illustrated in FIG. 1 and a curve of a leakage current of an a-Si device involving the TFT substrate structure of FIG. 4, wherein "N+" indicates the curve of variation of the leakage current Ioff of the a-Si device involving the TFT substrate structure of FIG. 1 with respect to gate voltage Vg and "IGZO" indicates the curve of variation of the leakage current Ioff of the a-Si device involving the TFT substrate structure of FIG. 4 with respect to gate voltage Vg. FIG. 5 shows, compared to the a-Si device including the TFT substrate structure of FIG. 1 (the prior art), the a-Si device including the TFT substrate structure of FIG. 4 (the present invention) has a reduced leakage current Ioff and the bending of the curve is alleviated (within the frame of phantom lines), thereby improving the reliability of the a-Si device.

In the above-described TFT substrate structure, the amorphous silicon layer comprises an IGZO layer to replace an N-type heavily-doped layer. The IGZO layer shows a reduced potential barrier with respect to the source/drain terminals, making it possible to form an ohmic contact and increase current efficiency.

Based on the same inventive idea, the present invention further provides a manufacturing method of a TFT substrate structure.

Figure 6:
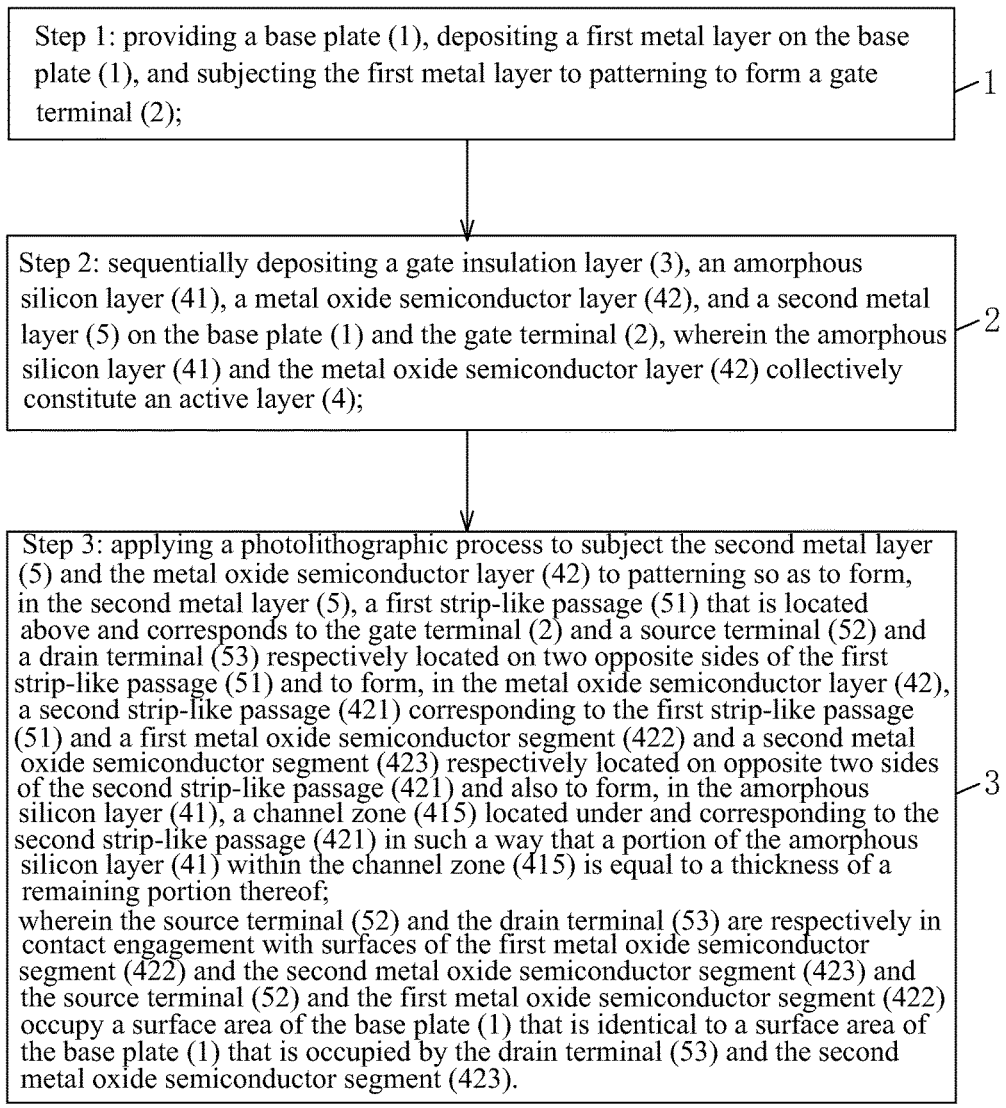
FIG. 6 is a flow chart illustrating a manufacturing method of a TFT substrate structure according to the present invention.
Figure 7:
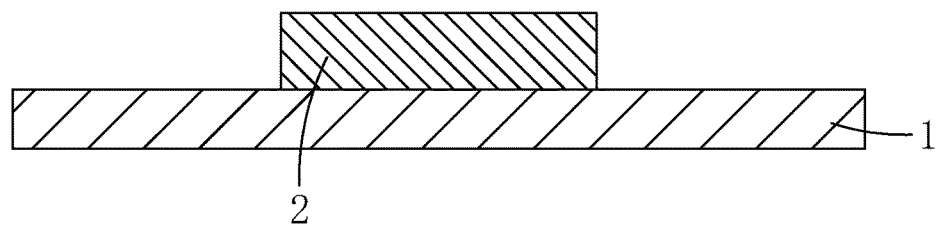
FIG. 7 is a schematic view illustrating a first step of the manufacturing method of the TFT substrate structure according to the present invention.

Referring to FIG. 6, the manufacturing method of the TFT substrate structure of the present invention comprises the following steps:

Step 1: as shown in FIG. 7, providing a base plate 1, depositing a first metal layer on the base plate 1, and subjecting the first metal layer to patterning to form a gate terminal 2.

Specifically, the base plate 1 comprises a glass board. The gate terminal 2 comprises a material of one of molybdenum, titanium, aluminum, and copper or a stacked combination of multiple ones thereof.

Figure 8:
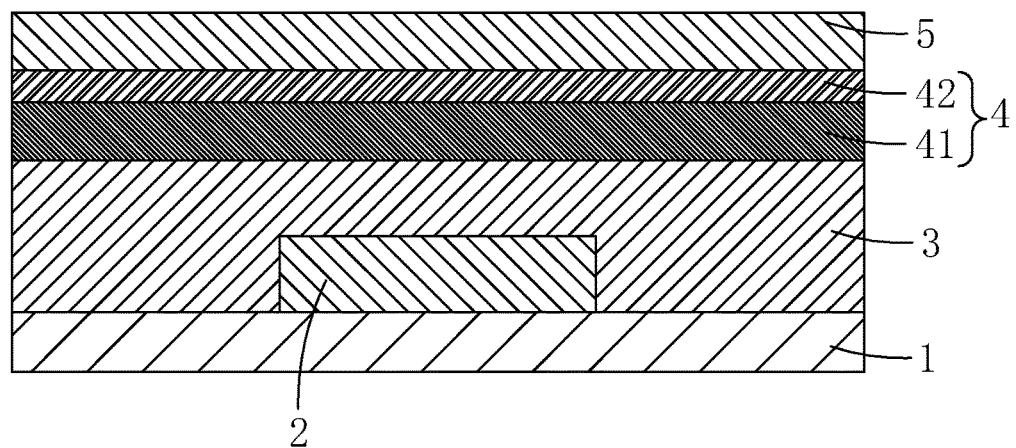
FIG. 8 is a schematic view illustrating a second step of the manufacturing method of the TFT substrate structure according to the present invention.

Step 2: as shown in FIG. 8, sequentially depositing a gate insulation layer 3, an amorphous silicon layer 41, a metal oxide semiconductor layer 42, and a second metal layer 5 on the base plate 1 and the gate terminal 2, wherein the amorphous silicon layer 41 and the metal oxide semiconductor layer 42 collectively constitute an active layer 4.

Specifically, chemical vapor deposition (CVD) is adopted to deposit the gate insulation layer 3 and the amorphous silicon layer 41 and physical vapor deposition (PVD) is adopted to deposit the metal oxide semiconductor layer 42 and the second metal layer 5.

Specifically, the gate insulation layer 3 comprises a material of silicon oxide, silicon nitride, or a combination thereof.

The metal oxide semiconductor layer 42 comprises a material of IGZO.

The second metal layer 5 comprises a material of one of molybdenum, titanium, aluminum, and copper or a stacked combination of multiple ones thereof.

Step 3: referring to FIG. 3, applying a photolithographic process to subject the second metal layer 5 and the metal oxide semiconductor layer 42 to patterning so as to form, in the second metal layer 5, a first strip-like passage 51 that is located above and corresponds to the gate terminal 2 and a source terminal 52 and a drain terminal 53 respectively located on two opposite sides of the first strip-like passage 51 and to form, in the metal oxide semiconductor layer 42, a second strip-like passage 421 corresponding to the first strip-like passage 51 and first and second metal oxide semiconductor segments 422, 423 respectively located on opposite two sides of the second strip-like passage 421 and also to form, in the amorphous silicon layer 41, a channel zone 415 located under and corresponding to the second strip-like passage 421 in such a way that a portion of the amorphous silicon layer 41 within the channel zone 415 is equal to a thickness of a remaining portion thereof, wherein the source terminal 52 and the drain terminal 52 are respectively in contact engagement with surfaces of the first metal oxide semiconductor segment 422 and the second metal oxide semiconductor segment 423 and the source terminal 52 and the first metal oxide semiconductor segment 422 occupy a surface area of the base plate 1 that is identical to a surface area of the base plate 1 that is occupied by the drain terminal 53 and the second metal oxide semiconductor segment 423.

Specifically, the first strip-like passage 51 and the second strip-like passage 421 are of the same width that is smaller than a width of the gate terminal 2.

Specifically, wet etching processes are applied to subject the second metal layer 5 and the metal oxide semiconductor layer 42 to patterning. The wet etching processes are carried out with etching conditions properly adjusted to prevent the occurrence of undercut.

If, after Step 3, no residue of the metal oxide semiconductor layer 42 is left on the portion of the amorphous silicon layer 41 located in the channel zone 415, meaning Step 3 completely etches off the portion of the metal oxide semiconductor layer 42 located on the channel zone 415, there is no need to carry out any other steps and the TFT substrate structure shown in FIG. 3 is obtained; and if Step 3 has not completely etched off the portion of the metal oxide semiconductor layer 42 on the channel zone 415, then Step 4 or Step 4' is conducted:

Step 4: subjecting the portion of the amorphous silicon layer 41 located in the channel zone 415 to a surface treatment to remove residues of the metal oxide semiconductor layer 42 left on the channel zone 415 in such a way that after the treatment, the thickness of the portion of the amorphous silicon layer 41 within the channel zone 415 is substantially equal to the thickness of the remaining portion thereof, and the TFT substrate structure shown in FIG. 3 is obtained.

Step 4': with the source and drain terminals 52, 53 and the first and second metal oxide semiconductor segments 52, 53 as an etch stop layer, subjecting the portion of the amorphous silicon layer 41 located in the channel zone 415 to partial etching so as to have the thickness of the portion of the amorphous silicon layer 41 within the channel zone 415 less than the thickness of a remaining portion thereof, and the TFT substrate structure shown in FIG. 4 is obtained.

Specifically, a dry etching process is applied to subject the portion of the amorphous silicon layer 41 within the channel zone 415 to the etching.

The above-described manufacturing method of a TFT substrate structure comprises forming an IGZO layer on an amorphous silicon layer to replace an N-type heavily-doped layer that is used in a known structure. The IGZO layer shows a relatively low potential barrier with respect to the source/drain terminals, making it possible to form an ohmic contact, increasing current efficiency, without the need to dope other ions to make the N-type heavily-doped layer. Further, the IGZO layer comprises numerous defects that trap holes so that during the operation of the TFT, even a great negative voltage is applied to the gate terminal to thus form a hole conducting channel, the holes may hardly move from the source/drain terminals through the IGZO layer and the amorphous silicon layer to reach the conducting channel and consequently, the current leakage issue occurring in a hole conducting zone of a conventional TFT substrate structure can be improved and severe bending of the hole current curve and poor reliability are also improved.

In summary, the present invention provides a TFT substrate structure, which comprises a metal oxide semiconductor layer arranged on an amorphous silicon layer to replace an N-type heavily-doped layer. The amorphous silicon layer shows a lower potential barrier with respect to a metal layer, making it possible to form an ohmic contact and increase current efficiency. The present invention provides a manufacturing method of a TFT substrate structure, which comprises forming a metal oxide semiconductor layer on an amorphous silicon layer to replace an N-type heavily-doped layer. The amorphous silicon layer and the metal oxide semiconductor layer have a lower potential barrier therebetween, making it possible to form an ohmic contact, increasing current efficiency, without the need to dope other ions to make the N-type heavily-doped layer. Further, the metal oxide semiconductor layer comprises numerous defects that trap holes so that during the operation of the TFT, even a great negative voltage is applied to the gate terminal to thus form a hole conducting channel, the holes may hardly move from the source/drain terminals through the metal oxide semiconductor layer and the semiconductor layer to reach the conducting channel and consequently, the current leakage issue occurring in a hole conducting zone of a conventional TFT substrate structure can be improved and severe bending of the hole current curve and poor reliability are also improved.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) substrate structure, comprising a base plate, a gate terminal formed on the base plate, a gate insulation layer formed on the base plate and covering the gate terminal, an active layer formed on the gate insulation layer, and a second metal layer formed on the active layer, wherein the second metal layer comprises a first strip-like passage that is located above and corresponds to the gate terminal and a source terminal and a drain terminal respectively formed on two opposite sides of the first strip-like passage;

the active layer comprises an amorphous silicon layer and a metal oxide semiconductor layer formed on the amorphous silicon layer, the metal oxide semiconductor layer comprising a second strip-like passage that corresponds to the first strip-like passage and first and second metal oxide semiconductor segments respectively formed on two opposite sides of the second strip-like passage and respectively corresponding to the source and drain terminals, the amorphous silicon layer comprising a channel zone located under and corresponding to the second strip-like passage, a portion of the amorphous silicon layer that is located in the channel zone having a thickness that is less than or equal to a thickness of a remaining portion thereof; and the source terminal and the drain terminal are respectively in contact engagement with surfaces of the first metal oxide semiconductor segment and the second metal oxide semiconductor segment and the source terminal and the first metal oxide semiconductor segment occupy a surface area of the base plate that is identical to a surface area of the base plate that is occupied by the drain terminal and the second metal oxide semiconductor segment.

2. The TFT substrate structure as claimed in claim 1, wherein the metal oxide semiconductor layer comprises a material of indium gallium zinc oxide (IGZO).

3. A manufacturing method of a thin-film transistor (TFT) substrate structure, comprising the following steps:
   (1) providing a base plate, depositing a first metal layer on the base plate, and subjecting the first metal layer to patterning to form a gate terminal;
   (2) sequentially depositing a gate insulation layer, an amorphous silicon layer, a metal oxide semiconductor layer, and a second metal layer on the base plate and the gate terminal, wherein the amorphous silicon layer and the metal oxide semiconductor layer collectively constitute an active layer; and
   (3) applying a photolithographic process to subject the second metal layer and the metal oxide semiconductor layer to patterning so as to form, in the second metal layer, a first strip-like passage that is located above and corresponds to the gate terminal and a source terminal and a drain terminal respectively located on two opposite sides of the first strip-like passage and to form, in the metal oxide semiconductor layer, a second strip-like passage corresponding to the first strip-like passage and a first metal oxide semiconductor segment and a second metal oxide semiconductor segment respectively located on opposite two sides of the second strip-like passage and also to form, in the amorphous silicon layer, a channel zone located under and corresponding to the second strip-like passage in such a way that a portion of the amorphous silicon layer within the channel zone is equal to a thickness of a remaining portion thereof,
   wherein the source terminal and the drain terminal are respectively in contact engagement with surfaces of the first metal oxide semiconductor segment and the second metal oxide semiconductor segment and the source terminal and the first metal oxide semiconductor segment occupy a surface area of the base plate that is identical to a surface area of the base plate that is occupied by the drain terminal and the second metal oxide semiconductor segment.

4. The manufacturing method of the TFT substrate structure as claimed in claim 3 further comprising step (4), in which the portion of the amorphous silicon layer that is located in the channel zone is subjected to a surface treatment to remove residues of the metal oxide semiconductor layer left on the channel zone in such a way that after the treatment, the thickness of the portion of the amorphous silicon layer within the channel zone is substantially equal to the thickness of the remaining portion thereof.

5. The manufacturing method of the TFT substrate structure as claimed in claim 3 further comprising step (4'), in which with the source and drain terminals and the first and second metal oxide semiconductor segments as an etch stop layer, the portion of the amorphous silicon layer that is located in the channel zone is subjected to partial etching so as to have a thickness of the portion of the amorphous silicon layer within the channel zone less than the thickness of a remaining portion thereof.

6. The manufacturing method of the TFT substrate structure as claimed in claim 3, wherein in step (2), chemical vapor deposition is adopted to deposit the gate insulation layer and the amorphous silicon layer and physical vapor deposition is adopted to deposit the metal oxide semiconductor layer.

7. The manufacturing method of the TFT substrate structure as claimed in claim 3, wherein in step (3), wet etching is applied to subject the second metal layer and the metal oxide semiconductor layer to patterning.

8. The manufacturing method of the TFT substrate structure as claimed in claim 5, wherein in step (4'), dry etching is applied to subject the portion of the amorphous silicon layer within the channel zone to the etching.

9. The manufacturing method of the TFT substrate structure as claimed in claim 3, wherein in step (1), the base plate comprises a glass board and the gate terminal comprises a material of one of molybdenum, titanium, aluminum, and copper or a stacked combination of multiple ones thereof.

10. The manufacturing method of the TFT substrate structure as claimed in claim 3, wherein in step (2), the metal oxide semiconductor layer comprises a material of indium gallium zinc oxide (IGZO).

11. A manufacturing method of a thin-film transistor (TFT) substrate structure, comprising the following steps:
   (1) providing a base plate, depositing a first metal layer on the base plate, and subjecting the first metal layer to patterning to form a gate terminal;
   (2) sequentially depositing a gate insulation layer, an amorphous silicon layer, a metal oxide semiconductor layer, and a second metal layer on the base plate and the gate terminal, wherein the amorphous silicon layer and the metal oxide semiconductor layer collectively constitute an active layer; and
   (3) applying a photolithographic process to subject the second metal layer and the metal oxide semiconductor layer to patterning so as to form, in the second metal layer, a first strip-like passage that is located above and corresponds to the gate terminal and a source terminal and a drain terminal respectively located on two opposite sides of the first strip-like passage and to form, in the metal oxide semiconductor layer, a second strip-like passage corresponding to the first strip-like passage and a first metal oxide semiconductor segment and a second metal oxide semiconductor segment respectively located on opposite two sides of the second strip-like passage and also to form, in the amorphous silicon layer, a channel zone located under and corresponding to the second strip-like passage in such a way that a portion of the amorphous silicon layer within the channel zone is equal to a thickness of a remaining portion thereof,
   wherein the source terminal and the drain terminal are respectively in contact engagement with surfaces of the first metal oxide semiconductor segment and the second metal oxide semiconductor segment and the source terminal and the first metal oxide semiconductor segment occupy a surface area of the base plate that is identical to a surface area of the base plate that is occupied by the drain terminal and the second metal oxide semiconductor segment;

wherein in step (2), chemical vapor deposition is adopted to deposit the gate insulation layer and the amorphous silicon layer and physical vapor deposition is adopted to deposit the metal oxide semiconductor layer;

wherein in step (3), wet etching is applied to subject the second metal layer and the metal oxide semiconductor layer to patterning;

wherein in step (1), the base plate comprises a glass board and the gate terminal comprises a material of one of molybdenum, titanium, aluminum, and copper or a stacked combination of multiple ones thereof; and wherein in step (2), the metal oxide semiconductor layer comprises a material of indium gallium zinc oxide (IGZO).

12. The manufacturing method of the TFT substrate structure as claimed in claim 11 further comprising step (4), in which the portion of the amorphous silicon layer that is located in the channel zone is subjected to a surface treatment to remove residues of the metal oxide semiconductor layer left on the channel zone in such a way that after the treatment, the thickness of the portion of the amorphous silicon layer within the channel zone is substantially equal to the thickness of the remaining portion thereof.

13. The manufacturing method of the TFT substrate structure as claimed in claim 11 further comprising step (4'), in which with the source and drain terminals and the first and second metal oxide semiconductor segments as an etch stop layer, the portion of the amorphous silicon layer that is located in the channel zone is subjected to partial etching so as to have a thickness of the portion of the amorphous silicon layer within the channel zone less than the thickness of a remaining portion thereof.

14. The manufacturing method of the TFT substrate structure as claimed in claim 13, wherein in step (4'), dry etching is applied to subject the portion of the amorphous silicon layer within the channel zone to the etching.

* * * * *